United States Patent
Inoue et al.

(10) Patent No.: US 8,445,903 B2
(45) Date of Patent: May 21, 2013

(54) THIN FILM TRANSISTOR HAVING A CRYSTALLINE SEMICONDUCTOR FILM INCLUDING INDIUM OXIDE WHICH CONTAINS A HYDROGEN ELEMENT AND METHOD FOR MANUFACTURING SAME

(75) Inventors: Kazuyoshi Inoue, Sodegaura (JP); Koki Yano, Sodegaura (JP); Shigekazu Tomai, Sodegaura (JP); Masashi Kasami, Sodegaura (JP); Hirokazu Kawashima, Sodegaura (JP); Futoshi Utsuno, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 5 days.

(21) Appl. No.: 13/125,577

(22) PCT Filed: Oct. 19, 2009

(86) PCT No.: PCT/JP2009/005446
§ 371 (c)(1),
(2), (4) Date: Apr. 22, 2011

(87) PCT Pub. No.: WO2010/047077
PCT Pub. Date: Apr. 29, 2010

(65) Prior Publication Data
US 2011/0198586 A1    Aug. 18, 2011

(30) Foreign Application Priority Data
Oct. 23, 2008 (JP) .................... 2008-273421

(51) Int. Cl.
*H01L 29/12* (2006.01)
(52) U.S. Cl.
USPC ............................. 257/43; 438/151

(58) Field of Classification Search
USPC ............... 257/3, 66, 288, 347, 368, E21.212, 257/E21.334, E21.347, E21.413, E21.462, 257/E27.116, E29.068, E29.079, E29.105, 257/E29.109; 438/151, 158, 161
See application file for complete search history.

(56) References Cited

U.S. PATENT DOCUMENTS
2006/0244107 A1  11/2006 Sugihara et al.
2008/0067508 A1*  3/2008 Endo et al. .................. 257/43

(Continued)

FOREIGN PATENT DOCUMENTS
JP    2007 073697    3/2007
JP    2007 103918    4/2007

(Continued)

OTHER PUBLICATIONS

Canon, Inc., "Method of manufacturing thin film transistor," Patent Abstracts of Japan, Publication Date: Mar. 22, 2007; English Abstract of JP-2007 073697.

(Continued)

*Primary Examiner* — Thomas L Dickey
(74) *Attorney, Agent, or Firm* — Millen, White, Zelano & Branigan, P.C.

(57) ABSTRACT

A thin film transistor including a gate electrode, a gate-insulating film, an oxide semiconductor film in contact with the gate-insulating film, and source and drain electrodes which connect to the oxide semiconductor film and are separated with a channel part therebetween, wherein the oxide semiconductor film comprises a crystalline indium oxide which includes hydrogen element, and the content of the hydrogen element contained in the oxide semiconductor film is 0.1 at % to 5 at % relative to all elements which form the oxide semiconductor film.

8 Claims, 2 Drawing Sheets

U.S. PATENT DOCUMENTS

| | | |
|---|---|---|
| 2009/0045397 A1 | 2/2009 | Iwasaki |
| 2009/0269880 A1 | 10/2009 | Itagaki et al. |
| 2010/0155717 A1 | 6/2010 | Yano et al. |
| 2010/0276689 A1 | 11/2010 | Iwasaki |
| 2010/0279462 A1 | 11/2010 | Iwasaki |
| 2011/0050733 A1 | 3/2011 | Yano et al. |

FOREIGN PATENT DOCUMENTS

| | | |
|---|---|---|
| JP | 2008 130814 | 6/2008 |
| WO | WO-2004 114391 | 12/2004 |
| WO | WO-2008 096768 | 8/2008 |
| WO | WO-2008 117810 | 10/2008 |

OTHER PUBLICATIONS

International Search Report for PCT/JP2009/005446 dated Dec. 22, 2009.

International Preliminary Report on Patentability for PCT/JP2009/005446 dated May 26, 2011.

* cited by examiner

THIN FILM TRANSISTOR HAVING A CRYSTALLINE SEMICONDUCTOR FILM INCLUDING INDIUM OXIDE WHICH CONTAINS A HYDROGEN ELEMENT AND METHOD FOR MANUFACTURING SAME

TECHNICAL FIELD

The invention relates to a thin film transistor having a crystalline semiconductor film comprising indium oxide which contains a hydrogen element, and a method for manufacturing the same.

BACKGROUND ART

In recent years, remarkable progress has been attained in displays. Various displays such as liquid crystal displays and EL displays have been actively incorporated in an OA apparatus such as a PC and a word processor. Each of these displays has a sandwich structure in which a display element is disposed between transparent conductive films.

Currently, a silicon-based semiconductor film has been used mainly as a switching device of a thin film transistor (TFT) or the like which is used to drive the above-mentioned display. The reason therefor is that, in addition to improved stability and processibility of a silicon-based thin film, a thin film transistor using a silicon-based thin film has advantages such as a high switching speed. Generally, this silicon-based thin film is fabricated by the chemical vapor deposition (CVD) method.

However, in the case of an amorphous silicon-based thin film, there are disadvantages that the switching speed is relatively low and images cannot be displayed when a high-speed animation or the like are displayed. Further, in the case of a crystalline silicon-based thin film, although the switching speed is relatively high, heating at a high temperature of 800° C. or higher, heating by means of a laser or the like is required, and hence, a large amount of energy and a large number of steps are required in production. Although a silicon-based thin film exhibits superior performance as a voltage element, it encounters a problem that its properties change with the passage of time when current is flown.

An oxide semiconductor has attracted attention as a material or the like which is used to obtain a transparent semiconductor film which is superior to a silicon-based thin film in stability and has light transmittance equivalent to that of an ITO film.

However, in a film containing crystals of indium oxide, in particular a polycrystalline film, oxygen deficiency tends to occur easily. It is believed that it is impossible to allow the carrier density to be $2 \times 10^{+17}$ cm$^{-3}$ or less even if the oxygen partial pressure during film formation is increased, an oxidization treatment or the like is conducted. Therefore, no attempt has been made to use this film as a semiconductor film or as a TFT.

Under such circumstances, Patent Document 1 discloses a thin film transistor having a semiconductor layer comprising indium oxide. Specifically, this document discloses a method in which a thin film transistor is obtained by subjecting an indium oxide film to a heat treatment under an oxidizing atmosphere. However, in the case of a thin film formed of indium oxide, performance of the resulting thin film transistor varies depending on heat treatment conditions, oxidizing atmosphere conditions, in particular, on humidity conditions when a heat treatment is conducted in the air, resulting in unstable transistor performance.

On the other hand, Patent Documents 2 and 3 disclose that an amorphous oxide semiconductor can be stably obtained due to the presence of a hydrogen element or a deuterium element in an amorphous oxide semiconductor film. However, since an amorphous oxide semiconductor film has problems that, due to its amorphous nature, a hydrogen element or a deuterium element within the film may be diffused in the air, or water molecules may enter the film from the air, allowing the amount of a hydrogen element in the film to be excessive and hence, making the resulting device to be unstable.

If crystalline indium oxide is used in a semiconductor film, since the resulting semiconductor film is not dissolved in oxalic acid, PAN or the like, which means that the film has etching resistance, there are advantages that a channel-etch TFT can be produced easily. However, it is significantly difficult to allow a crystalline indium oxide film alone to be semiconductive by sufficiently lowering the carrier density thereof. That is, if an indium oxide film is merely crystallized, carriers are generated due to oxygen deficiency or the presence of a positive tetravalent metal oxide which is a coexistent impurity, whereby the oxide indium film may become a conductor. Therefore, a TFT which uses crystalline indium oxide in a semiconductor film has not been fabricated so far.

RELATED ART DOCUMENTS

Patent Documents

Patent Document 1: JP-A-2008-130814
Patent Document 2: JP-A-2007-73697
Patent Document 3: JP-A-2007-103918

SUMMARY OF THE INVENTION

The object of the invention is to provide a thin film transistor which has stable performance even if heat treatment conditions during production, in particular, humidity conditions or the like when a heat treatment is conducted in the air, vary.

The inventors made intensive studies to attain the above-mentioned object. As a result, they have found that a high-performance thin film transistor can be obtained by using indium oxide containing a predetermined amount of a hydrogen element in a semiconductor film, and that, in the formation of a semiconductor film, a desired semiconductor film can be stably obtained by forming an amorphous indium oxide film containing a hydrogen element, and subsequently by subjecting the oxide film to a dehydrogenation treatment, thereby to control the amount of hydrogen contained therein. The invention has been made based on such a finding.

According to the invention, the following thin film transistor or the like are provided.

1. A thin film transistor comprising a gate electrode, a gate-insulating film, an oxide semiconductor film in contact with the gate-insulating film, and source and drain electrodes which connect to the oxide semiconductor film and are separated with a channel part therebetween,
   wherein the oxide semiconductor film comprises a crystalline indium oxide which comprises a hydrogen element, and
   the content of the hydrogen element contained in the oxide semiconductor film is 0.1 at % to 5 at % relative to all elements which form the oxide semiconductor film.
2. The thin film transistor according to 1 wherein the oxide semiconductor film further comprises a positive trivalent metal oxide other than indium oxide.

3. The thin film transistor according to 2 wherein the content of the positive trivalent metal oxide other than indium oxide is 0.1 to 10 at % relative to all elements contained in the oxide semiconductor film.

4. The thin film transistor according to 2 or 3 wherein the positive trivalent metal oxide other than indium oxide is one or more oxides selected from boron oxide, aluminum oxide, gallium oxide, scandium oxide, yttrium oxide, lanthanum oxide, praseodymium oxide, neodymium oxide, samarium oxide, europium oxide, gadolinium oxide, terbium oxide, dysprosium oxide, holmium oxide, erbium oxide, ytterbium oxide, and lutetium oxide.

5. A method for producing the thin film transistor according to any one of 1 to 4 comprising the steps of, forming a semiconductor film comprising indium oxide which comprises a hydrogen element, patterning the semiconductor film, dehydrogenating and crystallizing the semiconductor film, and forming source and drain electrodes such that the electrodes connect to the semiconductor film.

6. The method for producing a thin film transistor according to 5 wherein in the step of forming the semiconductor film, the content in volume of hydrogen molecules and/or water molecules in the film-forming atmosphere is 1% to 10%.

7. The method for producing a thin film transistor according to 5 or 6 wherein in the step of dehydrogenating and crystallizing the semiconductor film, the semiconductor film is subjected to a heat treatment at 150 to 450° C. for 0.1 to 1200 minutes.

8. The method for producing a thin film transistor according to any one of 5 to 7 which is a method for producing a channel etch thin film transistor.

9. The method for producing a thin film transistor according to any one of 5 to 7 which is a method for producing an etch-stopper thin film transistor.

According to the invention, a high-performance thin film transistor can be stably obtained even though heat-treatment conditions during production vary.

MODE FOR CARRYING OUT THE INVENTION

The thin film transistor (TFT) of the invention comprises a gate electrode, a gate-insulating film, an oxide semiconductor film in contact with the gate-insulating film, and source and drain electrodes which connect to the oxide semiconductor film and are separated with a channel part therebetween. This thin film transistor is characterized in that the oxide semiconductor film comprises a crystalline indium oxide semiconductor film which comprises a hydrogen element.

Figure 1:
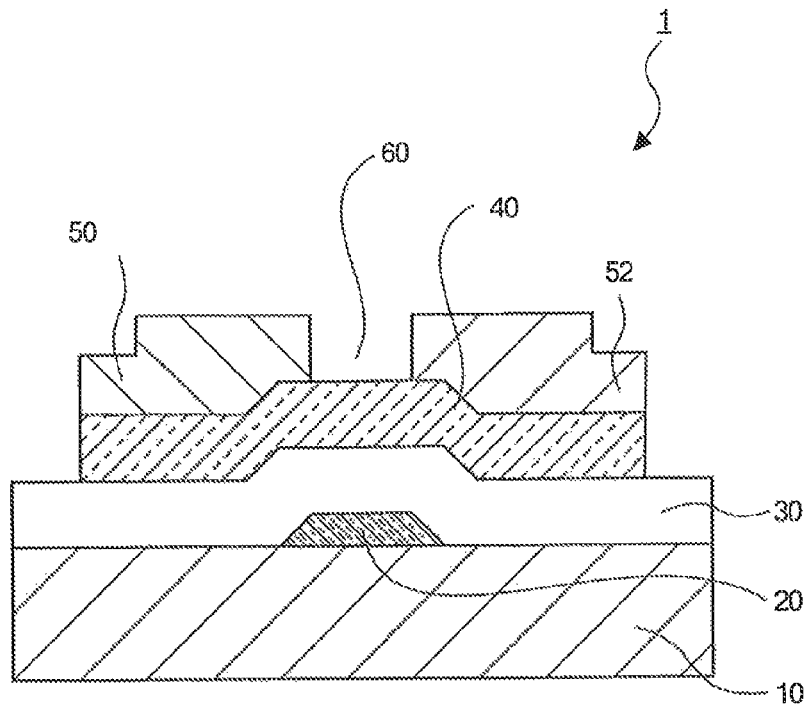
FIG. 1 is a schematic cross-sectional view showing an embodiment of a channel-etch thin film transistor of the invention.

FIG. 1 is a schematic cross-sectional view showing an embodiment of the thin film transistor of the invention.

A thin film transistor 1 has a gate electrode 20 between a substrate 10 and an insulating film 30. On the gate insulating film 30, a semiconductor film 40 is stacked as an active layer. Further, a source electrode 50 and a drain electrode 52 are formed such that they respectively cover near the end parts of the semiconductor film 40. A channel part 60 is formed in an area surrounded by the semiconductor film 40, the source electrode 50 and the drain electrode 52.

The thin film transistor 1 shown in FIG. 1 is a so-called channel-etch thin film transistor. The thin film transistor of the invention is not limited to a channel-etch thin film transistor, and a device configuration which is known in this technical field can be used.

Figure 2:
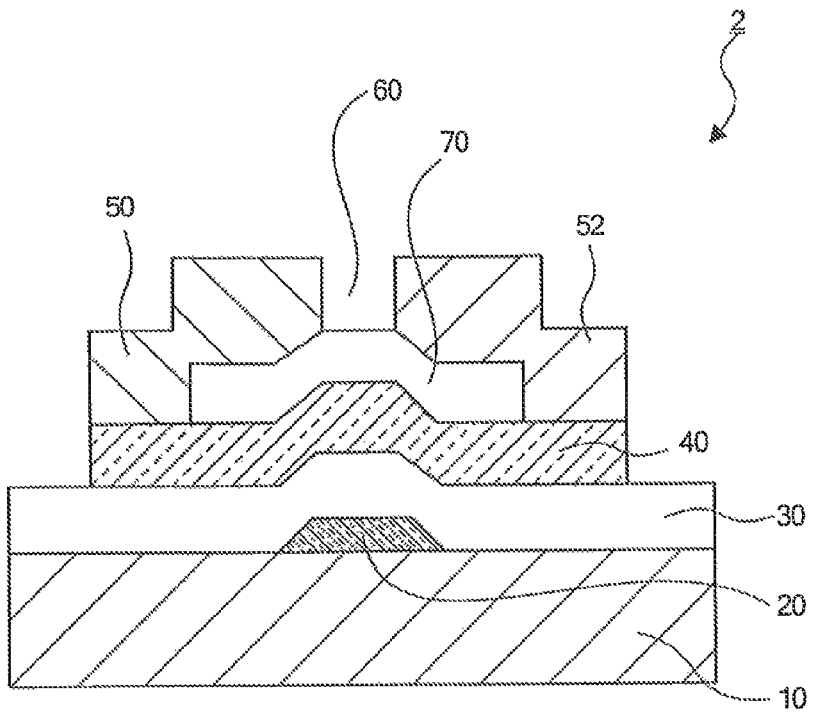
FIG. 2 is a schematic cross-sectional view showing an embodiment of an etch-stopper thin film transistor of the invention.

FIG. 2 is a schematic cross-sectional view showing another embodiment of the thin film transistor of the invention. The constituting elements which are the same as the constituting elements of the above-mentioned thin film transistor 1 are indicated by the same numerals, and an explanation thereof is omitted.

A thin film transistor 2 is an etch-stopper thin film transistor. The thin film transistor 2 has the same constitution as that of the above-mentioned thin film transistor 1 except that an etch stopper 70 is formed so as to cover the channel part 60. The source electrode 50 and the drain electrode 52 are formed such that they respectively cover near the end parts of the semiconductor film 40 and near the end parts of the etch stopper 70.

In the invention, as the semiconductor film 40, a crystalline indium oxide semiconductor film comprising indium oxide which contains a hydrogen element is used. Since the crystalline indium oxide film contains a hydrogen element, performance of the thin film transistor is stabilized. Indium oxide is a compound which tends to cause oxygen deficiency, and hence, it is used as a material for a transparent conductive film. It is believed that, since a hydrogen element fills a deficiency generated by oxygen deficiency to suppress generation of carriers, stabilization of a semiconductor is realized.

Further, due to the presence of a hydrogen element, it is possible to decrease the carrier concentration of the semiconductor film, specifically, to less than $2\times10^{+17}$ cm$^{-3}$, at a temperature around room temperature, whereby good thin film transistor properties are exhibited.

Meanwhile, it is preferred that the carrier density of the semiconductor film at a temperature around room temperature be less than $2\times10^{+17}$ cm$^{-3}$. If the carrier density is $2\times10^{+17}$ cm$^{-3}$ or more, the resulting transistor may not be driven as a TFT. Even if it is driven as a TFT, the TFT may operate in the normally-on state, have a significantly negative threshold voltage or have a small on-off value.

The content of a hydrogen element in the semiconductor film is preferably 0.1 to 5 at %, particularly preferably 0.5 to 3 at % relative to all elements contained in the semiconductor film. If the content is less than 0.1 at %, since the content is too small, an indium oxide thin film tends to become a conductive film, and stable TFT properties may not be obtained.

If the content of a hydrogen element exceeds 5 at %, a thin film may be an insulator film.

In the semiconductor film, a hydrogen element may be present in the form of a molecule or in the form of an atom. Further, it may connect to oxygen to be present in the form of a hydroxyl group. It is preferred that a hydrogen element present in the form of a hydroxyl group.

The content of hydrogen can be measured by the Rutherford backscattering spectrometry (RBS) method, the hydrogen forward scattering spectrometry (HFS) method or the thermal deposition spectrometry (TDS) method. In this invention, the content of a hydrogen element means a value measured by the hydrogen forward scattering spectrometry (HFS) method.

The content of a hydrogen element in the semiconductor film can be controlled by adjusting the hydrogen concentration in a film-forming atmosphere of the semiconductor film or the temperature or time of a dehydrogenation process after the film formation.

In the invention, a crystalline semiconductor film is used. By using a crystalline semiconductor film, mobility of a TFT can be increased. At the same time, durability can also be enhanced. In addition, it is possible to prevent the semiconductor film from being etched during etching of the source electrode 50 and the drain electrode 52.

Here, the "crystalline film" is a film of which the crystal peak can be confirmed by the X-ray diffraction analysis. Although a crystalline film may be a monocrystal film, an epitaxial film or a polycrystalline film, it is preferably an epitaxial film or a polycrystalline film since it can easily enables industrial production and an increase in size. A polycrystalline film is particularly preferable.

When a crystalline film is a polycrystalline film, it is preferred that the polycrystalline film be formed of nanocrystals. The average crystal particle size obtained by using Scherrer's equation from the X-ray diffraction analysis is normally 500 nm or less, preferably 300 nm or less, more preferably 150 nm or less and further preferably 80 nm or less. If the average crystal particle size exceeds 500 nm, properties of a transistor may vary largely if a transistor is miniaturized.

In the invention, it is further preferred that the semiconductor film contain a positive trivalent metal oxide other than indium oxide. As a result, oxygen deficiency generated in crystalline indium oxide can be suppressed easily, and hence, it is possible to obtain a thin film transistor which is operated stably.

As a positive trivalent metal oxide other than indium oxide, boron oxide, aluminum oxide, gallium oxide, scandium oxide, yttrium oxide, lanthanum oxide, praseodymium oxide, neodymium oxide, samarium oxide, europium oxide, gadolinium oxide, terbium oxide, dysprosium oxide, holmium oxide, erbium oxide, ytterbium oxide or lutetium oxide can preferably be used. These oxides may be used singly or in combination of two or more.

In respect of the fact that indium oxide including a positive trivalent metal oxide (excluding indium oxide) is crystallized more easily, it is preferred that the ionic radius of the metal element of a positive trivalent metal oxide to be added be as closer as possible to the ionic radius of the indium element. Specifically, one having an ionic radius which is different from that of the indium element within a range of ±30% is more preferably used. If the difference in ionic radius from that of the indium element exceeds 30%, the solubility limit may be decreased or the solid solution may not be occurred. In such a case, a positive trivalent metal may be solid soluble interstitially between crystal lattices, or a positive trivalent metal may be segregated in the crystal boundary. If the positive trivalent metal is segregated in the crystal boundary, it has an effect of suppressing oxygen deficiency occurred in the crystal boundary.

From the above-mentioned point of view, as the positive trivalent metal oxide (excluding indium oxide), gallium oxide, scandium oxide, yttrium oxide, neodymium oxide, samarium oxide, europium oxide, gadolinium oxide, terbium oxide, dysprosium oxide, holmium oxide, erbium oxide and ytterbium oxide are preferable, in particular.

The content of the positive trivalent metal oxide contained in the semiconductor film (excluding indium oxide) is preferably 0.1 to 10 at %, in particular 0.5 to 8 at %, as a metal element amount relative to all metal elements contained in the semiconductor film. If the content of the positive trivalent metal excluding indium is less than 0.1 at %, the amount of a positive trivalent metal oxide excluding indium oxide to be added is small, and effects thereof may not be sufficient enough to obtain a normally-off thin film transistor. When the content of the positive trivalent metal element exceeds 10 at %, the amount to be added is too large, whereby a crystalline indium oxide film may not be obtained. If a semiconductor film is formed of amorphous oxide indium, the carrier concentration may not be decreased, and the thin film transistor may become normally on or the mobility of the resulting transistor may not be improved.

The amount ratio of metal elements can be obtained by measuring the abundance of each element by the ICP-Mass (Inductively Coupled Plasma Mass) measurement.

In the invention, it is preferred that the content of a metal element having an atomic valency of positive tetravalency or higher be 10 ppm (in the present application, the "ppm" means "atomic ppm") or less. A metal element having an atomic valency of positive tetravalency or higher is present as an oxide in a semiconductor film. If a positive tetravalent metal oxide is captured in a crystal of indium oxide, it generates carriers within indium oxide to exert great effects on the performance of the semiconductor film. Further, due to heat treatment conditions of a semiconductor film, a metal element having an atomic valency of positive tetravalency or higher is solid-solution substituted in indium oxide to form an impurity level in the band structure of indium oxide, thereby affecting semiconductor properties. As a result, the carrier density at a temperature around room temperature may not be controlled to less than $2 \times 10^{+17}$ cm$^{-3}$. Therefore, a smaller content of a metal element with an atomic valency of positive tetravalency or higher is preferable. The content of a metal element with an atomic valency of positive tetravalency or higher is 5 ppm or less, with 1 ppm or less being more preferable.

Examples of an oxide of a metal with an atomic valency of positive tetravalency or higher contained in the semiconductor film include an oxide of a heavy metal with an atomic valency of positive teteravalency or higher such as titanium oxide, zirconium oxide, hafnium oxide, vanadium oxide, niobium oxide, tantalum oxide, chromium oxide, molybdenum oxide, tungsten oxide, manganese oxide, and silicon oxide, germanium oxide, tin oxide, lead oxide, antimony oxide, bismuth oxide and cerium oxide can be given.

Of the above-mentioned metal oxides, it is preferred that titanium oxide, zirconium oxide and tin oxide, in particular, be strictly controlled.

In the invention, it is preferred that the content of a metal element with an atomic valency of positive divalency or lower relative to all metal elements contained in the semiconductor film be 50 ppm or less. A metal element with an atomic valency of positive divalency or lower is present as an oxide within the semiconductor film. If an oxide of a metal with an atomic valency of positive divalency or lower is captured within a crystal of indium oxide, carrier traps may occur within indium oxide. As a result, mobility may be lowered, exerting great effects on the performance of the semiconductor film. Further, due to heat treatment conditions of a semiconductor film, a metal element having an atomic valency of positive divalency or lower is solid-solution substituted in indium oxide to form an impurity level in the band structure of indium oxide, thereby affecting semiconductor properties. Therefore, a smaller content of a metal element with an atomic valency of positive divalency or lower is preferable.

The content of a metal element with an atomic valency of positive divalency or lower is 10 ppm or less, with 5 ppm or less being more preferable.

Examples of an oxide of a metal with an atomic valency of positive divalency or lower contained in the semiconductor film include alkaline metal oxides or alkaline earth metal oxides such as lithium oxide, sodium oxide, potassium oxide, rubidium oxide, cesium oxide, magnesium oxide, calcium oxide, strontium oxide and barium oxide or the like and zinc oxide.

Of the above-mentioned metal oxides, it is preferred that sodium oxide, potassium oxide, magnesium oxide, calcium oxide and zinc oxide be strictly controlled.

In the thin film transistor of the invention, as for constituting elements such as a substrate, a gate electrode, a gate insulating film and a source/drain electrode, known elements can be used without particular restrictions.

For example, a thin film of a metal such as Al, Cu and Au can be used for each electrode, and a thin film of an oxide such as a silicon oxide film and a hafnium oxide film can be used for a gate insulating film.

Further, an insulating positive trivalent metal oxide film can be used as an etch stopper. Preferred examples of the positive trivalent metal oxide include boron oxide, aluminum oxide, gallium oxide, scandium oxide, yttrium oxide, lanthanum oxide, praseodymium oxide, neodymium oxide, samarium oxide, europium oxide, gadolinium oxide, terbium oxide, dysprosium oxide, holmium oxide, erbium oxide, ytterbium oxide or lutetium oxide, for example. Silicon oxide, silicon nitride or the like may be stacked on these films. Taking into consideration dry etching properties and cost, aluminum oxide, yttrium oxide or the like are preferable.

In addition to a positive trivalent metal oxide, if silicon oxide or the like are used in an etching stopper, for example, it may affect the semiconductor film. Specifically, if a silicon oxide film is formed by sputtering, thermal CVD, plasma CVD or the like on amorphous indium oxide which will serve as the semiconductor film, followed by crystallization by heating, a silicon element may be diffused in the indium oxide film and solid-soluted. In such a case, since carriers may be generated in the semiconductor film, causing the semiconductor film to be conductive, the off current may be increased and the on/off ratio may be decreased. Therefore, in a surface which is in contact with the semiconductor film of an etch stopper, it is preferable to use an insulating positive trivalent metal oxide film.

Next, a method for producing the thin film transistor of the invention will be explained.

The production method according to the invention comprises the steps of forming a semiconductor film comprising indium oxide which comprises a hydrogen element, patterning the semiconductor film, dehydrogenating and crystallizing the semiconductor film, and forming source and drain electrodes such that the electrodes connect to the semiconductor film.

Constituting elements such as a gate electrode, a gate insulating film and source/drain electrodes can be formed by a known method.

For example, on a substrate, a gate electrode comprising a thin film of a metal such as Al, Cu and Au is formed, and an oxide thin film comprising a silicon oxide film and hafnium oxide film or the like is formed as a gate insulating film. On the gate insulating film thus formed, by installing a metal mask, a semiconductor film comprising an indium oxide film is formed only on a necessary part. Thereafter, by using a metal mask, source/drain electrodes are formed on a necessary part, whereby a thin film transistor can be produced.

Hereinbelow, the film-forming step of the semiconductor film, which is the characteristic part of the invention, will be explained.

The semiconductor film comprising indium oxide comprising a hydrogen element can be formed by the sputtering method, the deposition method, the ion-plating method, the pulse laser deposition (PLD) method or the like. Of these methods, the sputtering method is preferable.

As for the sputtering method, a method using a sintered target is preferable. In particular, a sintered target comprising high-purity (having a purity of 99.99 at % or more, for example) indium oxide is preferable. In order to form the above-mentioned semiconductor film comprising a positive trivalent metal oxide (excluding indium oxide), it suffices to use a sintered target obtained by incorporating these metal oxides into indium oxide, for example. A sintered target can be produced by a method which is known in this technical field.

Sputtering conditions can be appropriately adjusted in accordance with the kind of targets to be used, the thickness of the semiconductor film or the like. As for the sputtering method, the RF sputtering method, the DC sputtering method and the AC sputtering method can be used. Of these methods, the DC sputtering method and the AC sputtering method are preferable due to a high film-forming speed.

By introducing a hydrogen element in a film-forming atmosphere by the above-mentioned method, an indium oxide semiconductor film containing a hydrogen element can be obtained. Specifically, film formation can be conducted in the state that hydrogen molecules (hydrogen gas) or water is incorporated into a film-forming atmosphere.

The content in volume of hydrogen molecules and/or water molecules in a film-forming atmosphere is preferably 1% to 10%, with 2% to 8% being particularly preferable.

As the method for allowing hydrogen molecules and/or water molecules to be present in a film-forming atmosphere, a method in which an argon gas containing hydrogen gas is used as a film-forming gas or a method in which water is directly sent to a film-forming chamber by means of a plunger pump or the like can be given. In the case of a gas, the content in volume can be controlled by the partial pressure of each gas component.

In the invention, it is preferred that oxygen be present during film formation of the semiconductor film. Due to the presence of oxygen during sputtering, effective dehydrogenation can be conducted in a dehydrogenation treatment step.

The semiconductor film thus obtained is then patterned. Patterning is conducted by a method such as wet etching and dry etching. If pattern formation by means of a mask, pattern formation by means of lift-off or the like is used in the formation of the semiconductor film, no patterning is necessary. In the invention, it is preferred that patterning be conducted by wet etching or by means of a mask.

The semiconductor film is subjected to dehydrogenation and crystallization treatments.

The dehydrogenation and crystallization steps have an effect of controlling the amount of a hydrogen element, which has been excessively added in indium oxide, to a fixed value. By conducting these steps, an oxide semiconductor film having stable performance can be always obtained. Further, by conducting a dehydrogenation step (oxidizing step), an indium oxide film is crystallized, whereby a thin film transistor having stable performance can be obtained.

As the step of subjecting the semiconductor film to a dehydrogenation step or as the step of crystallizing the semiconductor film, a method in which hydrogen is oxidized with oxygen or a method in which hydrogen molecules or water molecules are desorbed by heat can be mentioned. Specifically, a method such as heating in the air, heating in a non-oxidizing atmosphere (in an inactivated gas such as nitrogen or argon atmosphere), heating under vacuum can be used.

In the invention, a dehydrogenation treatment under vacuum or a dehydrogenation treatment in a non-oxidizing atmosphere is preferable.

Here, the "under vacuum" means a state in which air is evacuated. Specifically, it means a state in which the pressure is 500 Pa or less, preferably 300 Pa or less, and more preferably 100 Pa or less. A method of decreasing the degree of vacuum in the step-wise manner is also preferable.

As the heat treatment method, heating in an oven, contacting with a heating board (contact heating), lamp heating by means of an infrared lamp or the like, heating with light such as laser light, thermal plasma heating or the like can be used.

It is preferred that the heating temperature during the dehydrogenation treatment be 150 to 450° C. If the heating temperature is lower than 150° C., the semiconductor film may not be sufficiently crystallized. If the heating temperature exceeds 450° C., a substrate or a semiconductor film may be damaged. The heat treatment temperature is further preferably 180° C. to 350° C., with 200° C. to 300° C. being particularly preferable.

The heating time is preferably 0.1 to 1200 minutes. If the heating time is shorter than 0.1 minute, crystallization of the film may be insufficient since the treating time is too short. A heating time exceeding 1200 minutes is too long to be productive. A heat treatment time of 0.5 minute to 600 minutes is further preferable.

In respect of controlling the hydrogen concentration in the semiconductor film, the above-mentioned temperature and time conditions are preferable. If the conditions fall outside the above-mentioned range, the hydrogen concentration in the semiconductor film may not satisfy the range stipulated in the invention, which may result in a decrease in mobility of the thin film transistor.

Hydrogenation and crystallization of the semiconductor film may be conducted immediately after the formation of the semiconductor film or after the formation of other constituting elements such as source/drain electrodes or the like.

In the invention, since the semiconductor film contains a hydrogen element, stability of semiconductor properties is improved. Therefore, even if heat treatment conditions during production, in particular, humidity conditions or the like if a heat treatment is conducted in the air, vary, a thin film transistor having stable performance can be produced.

The production method of the invention is particularly suited as the method for producing a channel-etch thin film transistor. Since the semiconductor film of the invention is crystalline, as the method for forming source/drain electrodes and a channel part from a thin film of a metal such as Al, an etching step using photolithography can be used. That is, the semiconductor film is not etched with an etching solution for removing a metal thin film, whereby a metal thin film is selectively etched. The production method may be a method for producing an etch-stopper thin film transistor.

EXAMPLES

Example 1

(A) Fabrication of a Thin Film Transistor

Figure 3:
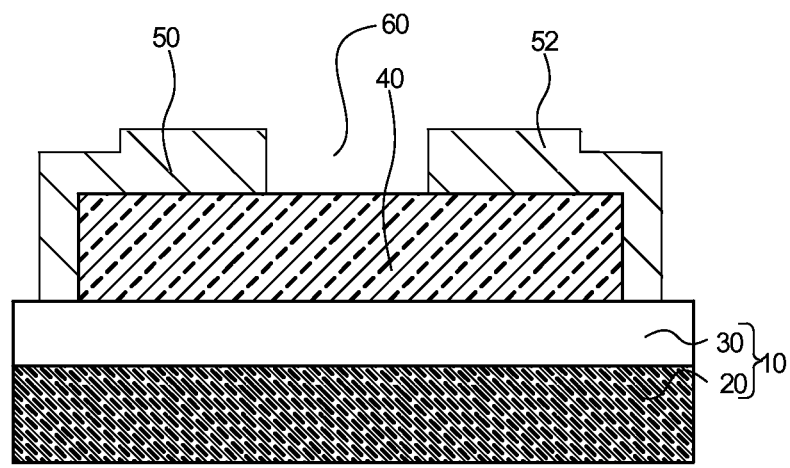
FIG. 3 is a schematic cross-sectional view of a channel-etch thin film transistor fabricated in Example 1.

A channel-etch thin film transistor shown in FIG. 3 was fabricated.

A conductive silicon substrate 10 provided with a 200 nm-thick thermally oxidized film ($SiO_2$ film) was used. The thermally oxidized film served as the gate insulating film 30 and the conductive silicon part served as the gate electrode 20.

Using a target formed of high-purity indium oxide (manufactured by Shonan Electron Material Laboratory, an oxide of a metal with an atomic valency of positive tetravalency or higher: as a representative example, one containing Si, Ti and Sr in a total amount of 0.09 ppm, an oxide of a metal with an atomic valency of positive divalency or lower: as a representative example, one containing Na, K, Mg and Zn in a total amount of 0.8 ppm), a 40 nm-thick semiconductor film 40 was formed on the gate insulating film 30 by the sputtering method. Sputtering was conducted as follows. After conducting vacuum evacuation until the back pressure became $5 \times 10^{-4}$ Pa, the pressure was adjusted to 0.6 Pa by flowing an argon gas containing 8 vol % of hydrogen at 9.0 sccm and oxygen at 1.0 sccm (that is, the hydrogen concentration in the film forming atmosphere was 7.2 vol %). Sputtering was conducted at a sputtering power of 100 W, with the substrate temperature being 150° C.

Thereafter, in order to dehydrogenate and crystallize the semiconductor film, the pressure inside the apparatus was set to 30 Pa with an argon gas, and the film was retained at 250° C. for 30 minutes.

After cooling the substrate temperature to room temperature, a molybdenum metal film (200 nm) was formed on the semiconductor film 40.

A resist was applied on the molybdenum metal film, and the resultant was prebaked at 80° C. for 15 minutes. Thereafter, the resist film was irradiated with UV light (light intensity: 300 mJ/cm$^2$) through a mask, and developed with a 3 wt % tetramethylammonium hydroxide (TMAH). After washing with pure water, the resist film was post-baked at 130° C. for 15 minutes, whereby a resist pattern having a desired shape of source/drain electrodes was formed.

By treating the substrate provided with a resist pattern with a mixed acid of phosphoric acid, acetic acid and nitric acid, the molybdenum metal film was etched. After peeling the resist off, and the resultant was then washed with pure water, dried by air blowing to form the source electrode 50 and the drain electrode 52, whereby a thin film transistor (the distance (L) between the source/drain electrodes of the channel part 60 was 10 μm and the channel width (W) was 50 μm) was fabricated.

This thin film transistor had normally-off properties with a field effect mobility of 82 cm$^2$/V·sec, an on-off ratio of $10^8$, a threshold voltage (Vth) of 0.5V and an S value of 0.7V/dec. The output characteristics showed a clear pinch-off.

(B) Evaluation of a Semiconductor Film

On a quarts glass substrate, a semiconductor film was formed under the same conditions as in the sputtering in (A). The resulting semiconductor film (before dehydrogenation and crystallization) was analyzed by the X-ray diffractometry (XRD). A peak derived from the bixbyite structure of indium oxide was not observed, which means that the film was amorphous. The hydrogen content of the semiconductor film was measured and found to be 3.53 at %. The hydrogen content was measured by the hydrogen forward scattering spectrometry method.

Thereafter, the pressure inside the apparatus was set to 30 Pa with an argon gas, and the film was retained at 250° C. for 30 minutes. The resulting semiconductor film was analyzed by the X-ray diffractometry (XRD), and a peak derived from the bixbyite structure of indium oxide was observed. The hydrogen content was 3.13 at %.

Example 2

Figure 4:
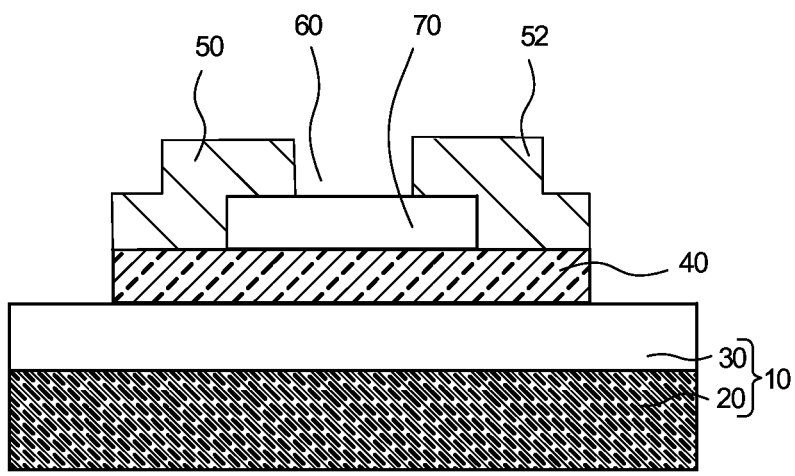
FIG. 4 is a schematic cross-sectional view of an etch-stopper thin film transistor fabricated in Example 2.

The etch-stopper thin film transistor shown in FIG. 4 was fabricated by the photoresist method.

In the same manner as in Example 1, on the conductive silicon substrate 10 provided with a thermally oxidized film (SiO$_2$ film), a 40 nm-thick semiconductor film 40 was formed by the sputtering method by using a target formed of high-purity indium oxide.

Sputtering was conducted as follows. After conducting vacuum evacuation until the back pressure became 5×10$^{-4}$ Pa, the pressure was adjusted to 0.5 Pa by flowing an argon gas containing 3 vol % of hydrogen at 9.0 sccm and oxygen at 1.0 sccm. Sputtering was conducted at room temperature at a sputtering power of 100 W, with the substrate temperature being room temperature.

Thereafter, by using aluminum oxide as a target, a 10 nm-thick film was formed by the RF sputtering method. Further, a 190 nm-thick film was formed thereon by using a silicon oxide target.

A resist was applied on the aluminum oxide-silicon oxide film formed on the semiconductor film 40, and the resultant was prebaked at 80° C. for 15 minutes. Thereafter, the resist film was irradiated with UV light (light intensity: 300 mJ/cm$^2$) through a mask, followed by development in 3 wt % tetramethyammonium hydroxide (TMAH). After washing with pure water, the resist film was post-baked at 130° C. for 15 minutes, whereby a resist pattern of an etch stopper in a desired shape was formed.

The substrate provided with a resist pattern was transferred to a dry etching apparatus, and dry etching was conducted with CF$_4$ gas. Further, the surface was washed and reduced by plasma by using argon containing 9% of hydrogen gas. Thereafter, the resist was peeled off, and the resultant was washed with pure water, and dried by air blowing to form an etch stopper 70.

Thereafter, a molybdenum metal film was formed in a thickness of 300 nm on the semiconductor film 40 and the etch stopper 70.

A resist was applied on the molybdenum metal film, and the resultant was prebaked at 80° C. for 15 minutes. Thereafter, the resist film was irradiated with UV light (light intensity: 300 mJ/cm$^2$) through a mask, followed by development in 3 wt % tetramethyammonium hydroxide (TMAH). After washing with pure water, the resist film was post-baked at 130° C. for 15 minutes, whereby a resist pattern of source/drain electrodes in a desired shape was formed.

The molybdenum metal film was etched by treating the substrate provided with a resist pattern with a mixed acid of phosphoric acid, acetic acid and nitric acid. The indium oxide film was simultaneously etched. Thereafter, the resist was peeled off, and the resultant was washed with pure water, and dried by air blowing to form the source electrode 50 and the drain electrode 52, whereby a thin film transistor (the distance (L) between the source/drain electrodes of the channel part 60 was 10 μm and the channel width (W) was 50 μm) was fabricated.

Thereafter, in order to dehydrogenate and crystallize the semiconductor film, the thin film transistor was subjected to a heat treatment at 300° C. for 30 minutes in the air in a hot air heating furnace.

This thin film transistor had normally-off properties with a field effect mobility of 86 cm$^2$/V·sec, an on-off ratio of 10$^8$, a Vth of 0.1V and an S value of 0.2V/dec. The output characteristics showed a clear pinch-off. A shift in voltage (Vth) after applying to the gate electrode a voltage of 20V for 100 minutes was 0.1V.

(B) Evaluation of Semiconductor Film

On a quarts glass substrate, a semiconductor film was formed under the same conditions as in the sputtering conditions mentioned above. The resulting semiconductor film (before dehydrogenation and crystallization) was analyzed by the X-ray diffractometry (XRD). A peak derived from the bixbyite structure of indium oxide was not observed, which means that the film was amorphous. The hydrogen content of the semiconductor film was measured and found to be 1.34 at %.

Thereafter, the semiconductor film was heat-treated at 300° C. for 30 minutes in air in a hot air heating furnace. The resulting semiconductor film was analyzed by the X-ray diffractometry (XRD). A peak derived from the bixbyite structure of indium oxide was observed. The hydrogen content of the semiconductor film was 0.11 at %.

Example 3

A thin film transistor was fabricated in the same manner as in Example 2, except that, instead of the target formed of high-purity indium oxide, an indium oxide target (an oxide of a metal with an atomic valency of positive tetravalency or higher: as a representative example, one with a total amount of Sn, Ti and Zr<0.1 ppm, an oxide of a metal with an atomic valency of positive divalency or lower: as a representative example, one with a total amount of Na, K, Mg and Zn=1 ppm) containing boron oxide, aluminum oxide, gallium oxide, scandium oxide, yttrium oxide, lanthanum oxide, praseodymium oxide, neodymium oxide, samarium oxide, europium oxide, gadolinium oxide, terbium oxide, dysprosium oxide, holmium oxide, erbium oxide, ytterbium oxide, and lutetium oxide respectively in a total amount of 2 at % was used.

The resulting thin film transistor had normally-off properties, with a field effect mobility of 60 cm$^2$/V·sec or more, an on-off ratio of about 10$^8$, a Vth of about 0.3V and an S value of 0.5V/dec or less. The output characteristics showed a clear pinch-off. A shift in voltage (Vth) after applying to the gate electrode a voltage of 20V for 100 minutes was 0.2V or less.

Each of the semiconductor films was crystalline and had a hydrogen content of 1.2 at % to 3.7 at %.

Comparative Example 1

A thin film transistor was fabricated in the same manner as in Example 1, except that, as the sputtering target, a target comprising indium oxide with a purity of 99.9% (an oxide of a metal with an atomic valency of positive tetravalency or higher: as the representative example, one with a total amount of Sn, Ti and Zr=200 ppm, an oxide of a metal with an atomic valency of positive divalency or lower: as the representative example, one with a total amount of Na, K, Mg and Zn=60 ppm) was used as the sputtering target, and sputtering was conducted in an atmosphere of 100%-purity argon and 100%-purity oxygen, with an oxygen concentration being 10 vol %.

The resulting thin film transistor had normally-on properties, with a field effect mobility of 3.1 cm$^2$/V·sec or more, an on-off ratio of about 10$^4$, a Vth of −5.1V and an S value of 7.3V/dec or less. The output characteristics showed a clear pinch-off. A shift in voltage (Vth) after applying to the gate electrode a voltage of 20V for 100 minutes was 1.4V or less.

The semiconductor film was crystalline and had a hydrogen content of less than 0.01 at %.

Comparative Example 2

An attempt was made to fabricate a thin film transistor in the same manner as in Example 1, except that, as the sputtering target, a target comprising an indium oxide, gallium oxide and zinc oxide with a purity of 99.9% (In:Ga:Zn=1:1:1 (atomic ratio)) was used and sputtering was conducted in an argon gas with a hydrogen content of 1 vol % and 100%- purity oxygen, with the hydrogen concentration and the oxygen concentration being adjusted to 0.96 vol % and 4 vol %, respectively.

However, during the process of etching the molybdenum metal film, the semiconductor film was dissolved, and hence, a thin film transistor could not be obtained.

The semiconductor film formed in Comparative Example 2 remained amorphous after dehydrogenation and crystallization. Therefore, the semiconductor film was dissolved when the molybdenum metal film was etched.

INDUSTRIAL APPLICABILITY

The thin film transistor of the invention can be preferably used in a display panel, an RFID tag, and a sensor such as an X-ray detector panel, a finger print sensor and a photosensor.

The method for producing a thin film transistor of the invention is particularly suited for the production of a channel-etch thin film transistor.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A thin film transistor comprising a gate electrode, a gate-insulating film, an oxide semiconductor film in contact with the gate-insulating film, and source and drain electrodes which connect to the oxide semiconductor film and are separated with a channel part therebetween,
   wherein the oxide semiconductor film comprises a crystalline indium oxide which comprises a hydrogen element, and
   the content of the hydrogen element contained in the oxide semiconductor film is 0.1 at % to 5 at % relative to all elements which form the oxide semiconductor film.

2. The thin film transistor according to claim 1 wherein the oxide semiconductor film further comprises a positive trivalent metal oxide other than indium oxide.

3. The thin film transistor according to claim 2 wherein the content of the positive trivalent metal oxide other than indium oxide is 0.1 to 10 at % relative to all elements contained in the oxide semiconductor film.

4. The thin film transistor according to claim 2 wherein the positive trivalent metal oxide other than indium oxide is one or more oxides selected from boron oxide, aluminum oxide, gallium oxide, scandium oxide, yttrium oxide, lanthanum oxide, praseodymium oxide, neodymium oxide, samarium oxide, europium oxide, gadolinium oxide, terbium oxide, dysprosium oxide, holmium oxide, erbium oxide, ytterbium oxide, and lutetium oxide.

5. A method for producing the thin film transistor according to claim 1 comprising the steps of,
   forming a semiconductor film comprising amorphous indium oxide which comprises a hydrogen element in the film-forming atmosphere in which the content in volume of hydrogen molecules and/or water molecules is 1% to 10%,
   patterning the semiconductor film,
   dehydrogenating and crystallizing the semiconductor film to obtain a crystalline indium oxide semiconductor film in which contains the hydrogen element of 0.1 at % to 5 at % relative to all elements which form the oxide semiconductor film, and
   forming source and drain electrodes such that the electrodes connect to the semiconductor film.

6. The method for producing a thin film transistor according to claim 5 wherein in the step of
   dehydrogenating and crystallizing the semiconductor film, the semiconductor film is subjected to heat treatment at 150 to 450° C. for 0.1 to 1200 minutes.

7. The method for producing a thin film transistor according claim 5 which is a method for producing a channel etch thin film transistor.

8. The method for producing a thin film transistor according to claim 5 which is a method for producing an etch stopper thin film transistor.

* * * * *